(12) United States Patent
Diaz et al.

(10) Patent No.: US 11,889,619 B2
(45) Date of Patent: Jan. 30, 2024

(54) CIRCUITRY FOR USE IN SMART CARDS AND OTHER APPLICATIONS

(71) Applicant: FREEVOLT TECHNOLOGIES LIMITED, London (GB)

(72) Inventors: Victor Diaz, London (GB); Vitor Freitas, London (GB); Sebastian Litwinow, London (GB); Alison Lloyd, London (GB)

(73) Assignee: FREEVOLT TECHNOLOGIES LIMITED, London (GB)

( * ) Notice: Subject to any disclaimer, the term of this patent is extended or adjusted under 35 U.S.C. 154(b) by 629 days.

(21) Appl. No.: 17/252,088

(22) PCT Filed: Jun. 14, 2019

(86) PCT No.: PCT/GB2019/051650
§ 371 (c)(1),
(2) Date: Dec. 14, 2020

(87) PCT Pub. No.: WO2019/239142
PCT Pub. Date: Dec. 19, 2019

(65) Prior Publication Data
US 2021/0259096 A1    Aug. 19, 2021

(30) Foreign Application Priority Data
Jun. 15, 2018  (GB) ..................... 1809852

(51) Int. Cl.
*H05K 1/02* (2006.01)
*H01P 5/12* (2006.01)
(Continued)

(52) U.S. Cl.
CPC .............. *H05K 1/0243* (2013.01); *H01P 5/12* (2013.01); *H02M 7/06* (2013.01); *H04B 5/0025* (2013.01); *H05K 1/165* (2013.01)

(58) Field of Classification Search
CPC ........ H05K 1/0243; H05K 1/165; H01P 5/12; H02M 7/06; H04B 5/0025
(Continued)

(56) References Cited

U.S. PATENT DOCUMENTS 6,134,130 A    10/2000  Connell et al.
6,175,727 B1    1/2001  Mostov
(Continued)

FOREIGN PATENT DOCUMENTS

GB        2428895      2/2007
WO    2015/022839      2/2015

OTHER PUBLICATIONS

Search Report for GB Application No. 1809852.5, dated Jul. 3, 2019.
(Continued)

*Primary Examiner* — Andargie M Aychillhum
(74) *Attorney, Agent, or Firm* — Barnes & Thornburg LLP

(57) ABSTRACT

A power splitter for a smart card having near field RF communications capability, the power splitter comprising a substrate for integration into said smart card; a first port for connection to a near field RF communications antenna for receiving an alternating electrical signal; a second port for connection to an auxiliary rectifier; and a third port for connection to a near field RF communicator; wherein the splitter comprises a impedance network, connected between the three ports, and being arranged to divide the alternating electrical signal between the second port and the third port to split the alternating electrical signal, wherein the impedance network comprises a printed coil inductor, and a zone of the substrate surrounding the printed coil inductor is free from any ground plane.

17 Claims, 3 Drawing Sheets

(51) Int. Cl.
*H02M 7/06* (2006.01)
*H04B 5/00* (2006.01)
*H05K 1/16* (2006.01)

(58) Field of Classification Search
USPC .......................................... 361/782
See application file for complete search history.

(56) References Cited

U.S. PATENT DOCUMENTS

| | | | |
|---|---|---|---|
| 2003/0156398 A1* | 8/2003 | Haden | H05K 1/0231 |
| | | | 361/780 |
| 2011/0036912 A1 | 2/2011 | Guo et al. | |
| 2013/0238910 A1 | 9/2013 | Liu et al. | |
| 2014/0035935 A1* | 2/2014 | Shenoy | H01L 23/15 |
| | | | 174/257 |
| 2018/0330216 A1 | 11/2018 | Wendling | |
| 2019/0044237 A1 | 2/2019 | Rangel et al. | |

OTHER PUBLICATIONS

Search Report & Written Opinion issued in Int'l Appl. No. PCT/GB2019/051650, dated Oct. 28, 2019.
Examination Report issued in EP19732421.3 (dated Feb. 9, 2023).

* cited by examiner

CIRCUITRY FOR USE IN SMART CARDS AND OTHER APPLICATIONS

This application is a U.S. National Stage application under 35 U.S.C. § 371 of PCT Application No. PCT/GB2019/051650, filed on Jun. 14, 2019, which claim priority from United Kingdom Application No. GB 1809852.5, filed Jun. 15, 2018, the entirety of which are each fully incorporated by reference herein.

FIELD OF INVENTION

The present invention relates to methods and apparatus, and more particularly to methods and apparatus for cards with integrated data processing or communications capabilities, commonly known as smart cards.

BACKGROUND

Smart cards, also known as chip cards, or integrated circuit cards (ICC), are increasingly prevalent. A wide variety of such pocket-sized cards with embedded integrated circuits are in use in a wide variety of applications. The most frequent uses of such cards relate to financial transactions, mass transit systems, and access control. Smart cards are made of plastic, generally polyvinyl chloride, but sometimes polyethylene-terephthalate-based polyesters, acrylonitrile butadiene styrene or polycarbonate. Reusable smart cards may also be made from paper. Such cards often incorporate an integrated circuit, IC, and some source of power such as a near field RF communications interface for powering the IC and providing data communications to and from it.

An IC device, herein called a chip, traditionally consists of a single semiconductor die which has a particular function and which is adapted to interact with other chips and components. For example, a traditional chip might be a microprocessor, a memory controller, or a memory array. IC systems may include two or more chips, as well as other electronic and electrical components, each attached to and interconnected through a mounting system such as a printed circuit board.

Near field RF (radio frequency) communication requires an antenna of one near field RF communicator to be present within the alternating magnetic field (H field) generated by the antenna of another near field RF communicator by transmission of an RF signal (for example a 13.56 Mega Hertz signal) to enable the magnetic field (H field) of the RF signal to be inductively coupled between the communicators. The RF signal may be modulated to enable communication of control and/or other data. Ranges of up to several centimetres (generally a maximum of 1 metre) are common for near field RF communicators.

Near field communication in the context of this application may be referred to as near-field RF communication, near field RFID (Radio Frequency Identification) or near field communication. The range of such devices depends on the antenna used but may be, for example, up to 1 metre. The precise range may depend on transmit power, and modulation scheme.

Communication of data between NFC communicators may be via an active communication mode in which the NFC communicator transmits or generates an alternating magnetic field modulated with the data to be communicated and the receiving NFC communicator responds by transmitting or generating its own modulated magnetic field, or via a passive communication mode in which one NFC communicator transmits or generates an alternating magnetic field and maintains that field and the responding NFC communicator modulates the magnetic field to which it is inductively coupled with the data to be communicated, for example by modulating the load on the inductive coupling ("load modulation"). Near field RF communicators may be actively powered, that is have an internal or associated power source, or passively powered, that is derive a power supply from a received magnetic field. Generally an RF transceiver will be actively powered while an RF transponder may be passively or actively powered.

Examples of near field RF communicators are defined in various standards for example ISO/IEC 18092 and ISO/IEC 21481 for NFC communicators, and ISO/IEC 14443 and ISO/IEC 15693 for near field RF communicators.

The ability of near field RF communications devices to be passively powered is a significant benefit. Some near field communicator chips also provide auxiliary power outputs. This can enable power harvested by the near field RF communicator to be used by other circuits.

UK patent application GB2531378 describes an RFID system in which when an RFID reader sends a command to an RFID device, the device does not respond, but rather waits and harvests the power to drive some auxiliary functionality e.g. functionality not required for responding to the command, for example the command may be a "request to provide identification code" command. In this prior art system, a response to the command from the RFID device is intentionally delayed so as to allow the auxiliary function to be performed first. In this system, the auxiliary function is biometric authentication, and the RFID device does not respond to the command until the biometric authentication has been completed.

This may extend the interaction time of the RFID device (e.g. the period of time for which an RFID device must be held in proximity to a reader). The perceived delay in operation associated with this may be unacceptable to users.

Miniaturisation of circuitry for smart cards often leads to the use of so called system-on-chip, or SoC, architecture in which a variety of functionality is integrated into a single semiconductor chip. This can significantly simplify the manufacture of smart cards, because little more than antennas or electrical connections need be provided on the smart card itself.

SUMMARY

Aspects and examples of the present invention are set out in the appended claims and may aim to increase energy efficiency of miniaturised power splitters, and other components, integrated into smart cards for dividing electrical power between communications functionality and other functionality carried by the smart card.

Some aspects are directed to apparatus incorporating auxiliary power harvesting (such as auxiliary rectifiers) into near field radio frequency (RF) communications enabled smart card apparatus. Such aspects may be provided on sheetlike substrates, such as laminar polymeric structures—for example polyaramide sheets. These may be flexible, and are typically less than 200 micron thick. They carry circuitry components for integration into said smart cards, such as electrical connections, transmission lines, and components of rectifiers.

An aspect of the disclosure provides a power splitter for a smart card having near field RF communications capability, the power splitter comprising an impedance network, connected to split a received alternating electrical signal between two outputs. The impedance network comprises a printed coil inductor on a dielectric substrate and a zone of the substrate surrounding the printed coil inductor is free from any ground plane.

This may provide a margin around the entire outer boundary of the printed coil inductor which is free from any electrical conductor at all, other than conductive tracks which connect the printed coil inductor to other circuitry components of the smart card.

The substrate may comprise a layer of conductive material comprising a gap in the layer beneath the region of the dielectric occupied by the printed coil inductor. This gap may be uninterrupted (e.g. contiguous) and surrounds and encompasses the region of the dielectric occupied by the printed coil inductor.

For example, this gap may be provided in the layer of conductive material beneath the region of the dielectric which is occupied by the printed coil inductor. The area of this gap may be larger than that occupied by the printed coil inductor itself—indeed the margin may be large enough that the area of the gap may be at least 10% larger than the area within the outer boundary of the printed coil inductor.

The ratio of the area of the gap to that occupied by the printed coil inductor may be selected based on the inductance of the printed coil inductor. For example, a printed coil inductor having an inductance of about 30 nH may be surrounded by a conductor free margin which provides a ratio of the area of the gap to that occupied by the printed coil inductor of at least 1.15, for example at least 1.3.

As another example, a printed coil inductor having an inductance of about 100 nH may be surrounded by a conductor free margin which provides a ratio of the area of the gap to that occupied by the printed coil inductor of at least 1.05, for example at least 1.1, for example at least 1.2.

As another example, a printed coil inductor having an inductance of about 500 nH may be surrounded by a conductor free margin which provides a ratio of the area of the gap to that occupied by the printed coil inductor of at least 1.03, for example at least 1.05, for example at least 1.1.

Typically, this ratio, irrespective of inductance, can be less than 2 without appreciable degradation of the Q-factor of the printed coil inductor.

The splitter may be configured so that the output impedance of the second port is maintained (e.g. to a reasonable degree) in the event of fluctuations in the output impedance of the third port. The output impedance of the third port may also be maintained (to a similarly reasonable degree) in the event of fluctuations in the output impedance of the second port. The splitter may be implemented in whole or in part by a system on chip (SoC). It may also be implemented at least in part in lumped components. For example, the impedance network may comprise a Wilkinson divider incorporating said printed coil inductor.

An aspect of the disclosure provides an auxiliary rectifier apparatus for integration into a smart card having near field RF communications capability, the apparatus comprising:

a substrate carrying electrical components in said smart card for connection to a near field RF communications chip;

a rectifying element on said substrate separate from said near field RF communications chip for rectifying an alternating electrical signal provided from a near field RF communications antenna connected to said near field RF communications chip to provide an auxiliary power supply;

and wherein the rectifier further comprises a printed coil inductor, connected to the rectifying element, wherein the printed coil inductor is provided on and surrounded by a region of the substrate that does not comprise any ground plane.

A ground plane may be provided beneath the rectifying element. For example a layer of conductive material may be carried by the dielectric substrate on the other side of the substrate from the rectifying element.

A low pass filter on said substrate and connected to the output of the rectifying element; wherein the low pass filter comprises the printed coil inductor.

Communications functionality of smart cards is typically provided by a near field RF communicator chip. But any RF communicator may be used, such as a Bluetooth® IC.

An aspect of the disclosure comprises a smart card comprising an IC mounting system in combination with any power splitter described herein. Such a smart card may comprise a near field RF communications antenna.

Other aspects and examples of the present disclosure are set out in the appended claims

BRIEF DESCRIPTION OF DRAWINGS

Embodiments of the disclosure will now be described in detail with reference to the accompanying drawings, in which.

In the drawings like reference numerals are used to indicate like elements.

SPECIFIC DESCRIPTION

Figure 1:
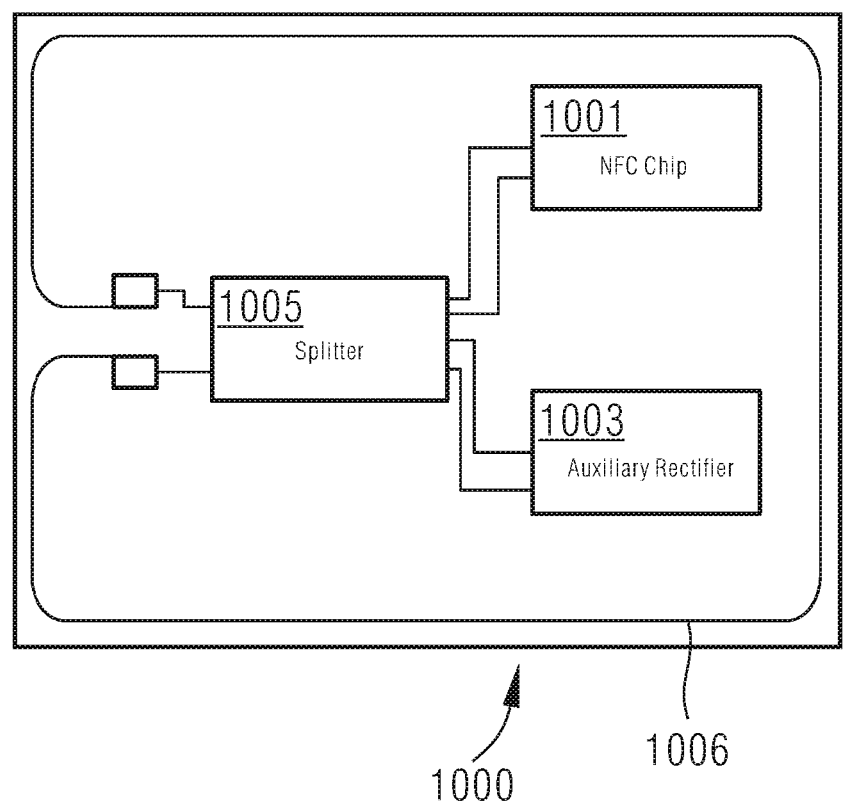
FIG. 1 shows a smart card apparatus comprising a near field RF communicator.

FIG. 1 illustrates a smart card 1000 comprising a system 1001, 1003, 1005 according to the present disclosure and a near field RF communications antenna 1006. The system 1001, 1003, 1005 is provided on a dielectric substrate (not separately illustrated in FIG. 1) which is integrated into the smart card.

The splitter 1005 is connected to the near field RF communications antenna for receiving an alternating electrical signal. A first output from the splitter is connected to the near field RF communications apparatus 1001, and a second output from the splitter 1005 is connected to the auxiliary rectifier 1003.

The auxiliary rectifier 1003 comprises a rectifying element, such as a diode, for converting alternating current (AC) signals received, via the splitter, from the antenna into direct current (DC) electrical signals to provide power to auxiliary smart card functions, such as biometric sensors, and data processors for verifying biometric data obtained by said sensors. The rectifying element of the auxiliary rectifier 1003 may be disposed on a region of the dielectric substrate which overlies the layer of conductive material. The layer of conductive material can thus provide a ground plane for the rectifying element.

The layer of conductive material (e.g. a ground plane) may be provided beneath a region of this dielectric which carries this and perhaps other circuitry components of the system. One or more parts of the system 1001, 1003, 1005 may also comprise a printed coil inductor, and a gap is provided in the layer of conductive material beneath the region of the dielectric which is occupied by the printed coil inductor.

The area occupied by this gap may be larger than that occupied by the printed coil inductor itself—indeed the area of the gap may be at least 10% larger than the area within the outer boundary of the printed coil inductor. The region of the substrate which overlies this gap may also be free from any conductors other than the printed coil inductor and the connections thereto. This may provide a margin, or exclusion zone, surrounding the outer boundary of the printed coil inductor free from any conductors other than the printed coil inductor and the connections thereto.

The use of a printed coil inductor in this context may assist in the provision of a low profile system adapted for being fully encapsulated within a smart card. However, such inductors may occupy a relatively large area, which is undesirable. They may also have a low-Q factor (the ratio of the imaginary part of their impedance to the real part of their impedance) which in the context of a need for high efficiency is still more undesirable. Counter intuitively, the inventors in the present case have found that the provision of a gap in the ground plane (and perhaps also a margin surrounding the inductor) can increase efficiency by providing higher Q-factor.

The smart card 1000 may have dimensions of a credit card such as that defined in ISO/IEC 7810 standard, for example it may be about 85 mm by about 55 mm (for example 85.60 by 53.98 millimetres). As an alternative, it may have an ID-000 form factor, e.g. about 25 mm by 15 mm (0.98 in×0.59 in) commonly used in SIM cards. The majority of the external surface area of the smart card may be embossed with identifying markings such as the name of the owner account codes. Other identifiers, such as holograms, may be inlaid onto its surface. The smart card 1000 may comprise a body of a dielectric substance such as plastic, e.g. polyvinyl chloride, or a polyethylene-terephthalate-based polyester.

The body of the smart card encapsulates the antenna 1006, and the system 1001, 1003, 1005. The smart card may have a total thickness of less than 3 mm, for example less than 2 mm, for example about 0.76 millimetres (0.030 in) thick. The system 1001, 1003, 1005 may be confined to an area of the smart card the outer surfaces of which are free from embossed marking and/or inlaid features such as holograms. As such, space may be at a premium and there may be a significant need for miniaturisation.

The system 1001, 1003, 1005, comprises a splitter 1005, a near field RF communications apparatus 1001, e.g. in the form of an IC, and an auxiliary rectifier 1003. It may also comprise some auxiliary circuits (not shown in FIG. 1) connected to the rectifier for performing auxiliary smart card functions such as biometrics and/or data processing function. These may occupy yet further space and provide a further need for miniaturisation.

As described above, the circuitry components which make up the splitter 1005 and/or the auxiliary rectifier 1003 may be carried on a dielectric substrate. This dielectric substrate may be sheetlike (e.g. a flexible laminar structure) sandwiched between two insulating layers which encapsulate it and provide structural support to the sheetlike dielectric to make up the smartcard. These two insulating layers may comprise paper and/or plastics such as polyvinyl chloride, polyethylene-terephthalate-based polyesters, acrylonitrile butadiene styrene or polycarbonate. The sheetlike dielectric comprises a first region in which a ground plane conductor is provided in the form of a layer of conductive material, separated from the circuitry components by a layer of the dielectric.

Figure 2:
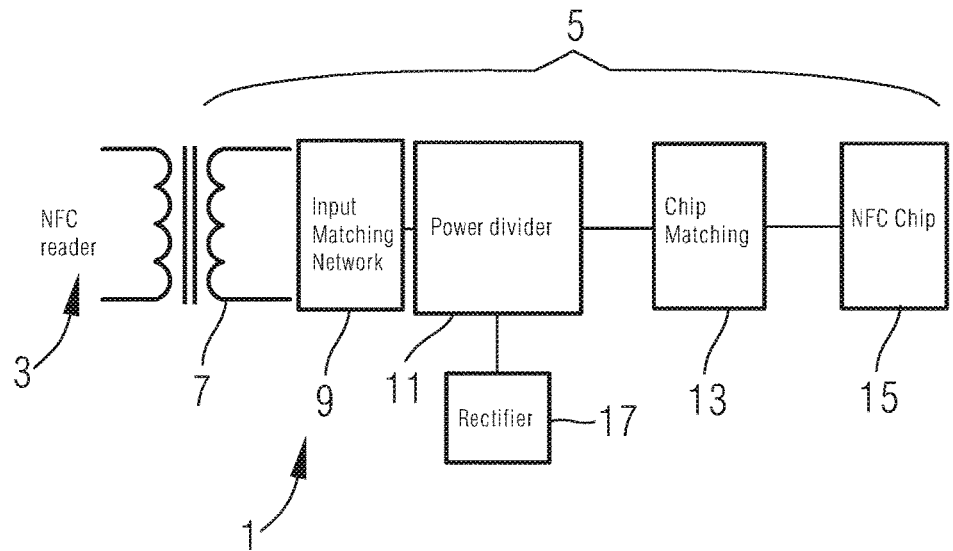
FIG. 2 shows a system comprising a near field RF communications reader and a smart card apparatus such as that illustrated in FIG. 1.

FIG. 2 shows a system 1 comprising an NFC reader 3, and a near field RF communications apparatus 5.

The near field RF communications apparatus 5 comprises an NFC antenna 7, connected by a power splitter 9, 11, 13 to a near field RF communicator chip 15 and to an auxiliary rectifier 17, which is separate from the near field RF communicator 15.

The power splitter comprises a power divider 11, an input matching network 9, and a chip matching network 13. The input matching network 9 connects the antenna 7 to the power divider 11, and the chip matching network 13 connects the power divider 11 to the near field RF communicator chip 15.

The NFC antenna 7 comprises an electrical conductor such as a conductive track or wire arranged for coupling inductively with an alternating H-field to provide an alternating electrical signal. Typically, such an antenna 7 comprises a loop having one or more turns. It will be appreciated in the context of the present disclosures that an NFC antenna may have a large inductance, perhaps of 1 μH or more. Such antennas may be adapted for coupling with signals in a near field RF frequency band, which generally comprises 13.56 MHz. It will be appreciated in the context of the present disclosure that such signal may have a wavelength of approximately 22 m.

The near field RF communicator chip 15 comprises an integrated circuit, which may be implemented as a single semiconductor die. This chip 15 may comprise a front end, for connection to the antenna. The front end may include things such as a voltage regulator, a dedicated rectifier for the near field RF communicator, or other circuitry for connecting the near field RF communicator to the antenna. The chip 15 also comprises a controller for performing simple data operations such as modulating and demodulating data from signals received via the antenna.

The auxiliary rectifier 17 comprises a rectifying element, such as a diode, arranged to convert the alternating electrical signal received from the splitter into a direct current, DC, electrical signal. This DC electrical signal may be used to power an auxiliary circuit, such as a biometric processing device. The rectifier may also comprise components for matching the input and/or output impedance of the rectifier to the circuits to which it is connected.

The power splitter 9, 11 illustrated in FIG. 2 may comprise lumped components connected together in an impedance network to provide (a) an input matching network 9 for providing an input impedance which matches the output impedance of the antenna, and (b) the power divider 11 which divides an alternating electrical signal received from the antenna 7 via the input matching network into two parts and (c) the chip matching network 13 for providing an output impedance from the power splitter 9, 11, 13 which matches the input impedance of the near field RF communications chip 15. This splitter may also comprise a rectifier matching network for providing an output impedance from the power splitter 9, 11, 13 which matches the input impedance of the rectifier. Significantly, the ability to provide inductors of high-Q factor improves the accuracy of this matching thereby increasing the efficiency with which power can be harvested from the incoming alternating electrical signal and divided between the near field RF communicator and the auxiliary rectifier.

The two parts of the electrical signal provided by the power divider 11 comprise a first part and a second part. The power divider is configured to provide the first part to the rectifier, e.g. via the rectifier matching network (not shown in FIG. 2), and to provide the second part to the near field RF communicator chip, e.g. via the chip matching network 13. For example, the power divider 11 may comprise a bifurcated electrical conduction path, starting at an input leg and splitting into two arms, one via the chip matching network 13 and the other via the rectifier matching network.

Figure 3:
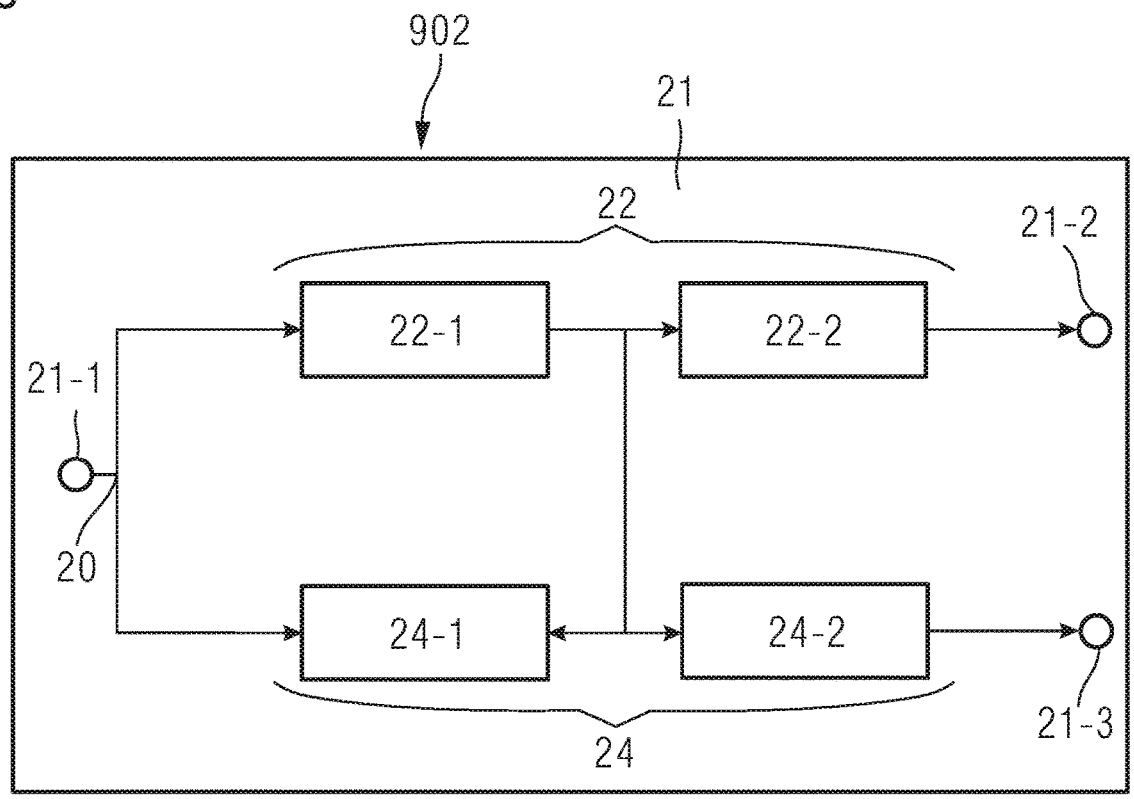
FIG. 3 shows a power splitter for use in a system such as that illustrated in FIG. 1.

FIG. 3 is a functional block diagram of one example of a splitter 902 such as that described above with reference to FIG. 1 or FIG. 2.

The splitter 902 illustrated in FIG. 3 comprises a first port 21-1 for connection to a near field RF communications antenna, a second port 21-2 for connection to an auxiliary rectifier, and a third port 21-3 for connection to a near field RF communicator.

The first port 21-1 is connected by an impedance network 22-2, 22-4, 24-2, 24-4 to both the second port 21-2 and to the third port 21-3.

The splitter 902 is carried on a dielectric substrate 21 for integration into a smart card. This may be a laminar dielectric of less than about 100 micron, for example about 76 micron. The dielectric substrate 21 may carry a layer of conductive material, which may be about 35 micron thick. This may be deposited on a major surface of the substrate, or integrated within it. At least some gaps are provided in this layer, so that there are areas of the substrate in which the ground plane is absent (e.g. areas in which there is no conductive material on or between the two major surfaces of the substrate).

In FIG. 3 the first port 21-1 is connected by a bifurcated electrical conduction path 20 to two output arms 22, 24. The first output arm 22 connects one side of the bifurcation to the second port 21-2. The second output arm connects the other side of the bifurcation to the third port 21-3.

The impedance network 22-2, 22-4, 24-2, 24-4 comprises at least one printed coil inductor, which is disposed on a surface of the dielectric substrate 21. The printed coil inductor is provided on an area of that surface which overlies a gap in the ground plane. This gap in the ground plane is larger than the printed coil inductor, so that the outer boundary of the printed coil inductor is surrounded (e.g. around its entire outer border) by a margin of dielectric material from which the ground plane is absent. Indeed, typically, in this margin no conductive material is present other than tracks to provide electrical connection between the printed coil inductor and the rest of the impedance network.

One or more of such printed coil inductors, with this gap/ground plane arrangement may be included in either or both of these arms 22, 24. Other circuitry components on the dielectric substrate may be disposed on a region of the dielectric substrate which overlies the layer of conductive material. The layer of conductive material can thus provide a ground plane for these other circuitry components.

One example of an impedance network to provide these connections is illustrated in FIG. 3. In that example, the first output arm 22 comprises an input stage 22-1 and an output stage 22-2, which are connected together in series. Likewise, the second output arm 24 also comprises an input stage 24-1 and an output stage 24-2. The input stage 22-1 of the first arm 22 is connected between the input leg 20 and the output stage 22-2 of the first arm 22. The input stage 24-1 of the second arm 24 is connected between the input leg 20 and the output stage 24-2 of the second arm 24. The connection between the input stage 22-2 and the output stage 22-4 of the first arm 22 is connected, e.g. by a resistor (not shown) or other pure real impedance, to the connection between the input stage 24-1 and the output stage 24-2 of the second arm 24. The input stages 22-1, 24-1, and output stages 22-2, 24-2 of the two arms 22, 24 may each comprise networks of passive, reactive, components such as inductors (e.g. the printed coil inductors mentioned above) and capacitors arranged to provide a phase shift to the input signal.

The phase shift provided by the input stage 22-1, 24-1 of each arm 22, 24 may be equal to that provided by the input stage of the other arm 24, 22. Also, the phase shift provided by the output stage of each arm may be equal to that provided by the output stage of the other arm. These stages may be arranged as either high pass filters, or low pass filters. Significantly, the use of such structures may reduce changes in the output impedance of one arm due to changes in the load/impedance presented at the output of the other arm. By selecting the impedance of these different stages appropriately, the power of the alternating electrical signal received from the input leg may be divided between the two arms according to a selected ratio, R. The division of power between the first arm and the second arm may be controlled by selecting the ratio of the impedance of the input stage of the each arm relative to the output stage of that arm, and by selecting the ratio of the impedance of the input stage of the first arm to the impedance of input stage of the second arm.

For example, a ratio of power division, R, may be provided between a 'main branch' arm which takes more of the power from the input leg than a 'secondary branch' arm. To achieve this, the magnitude of the impedance of the input stage of the 'main branch' arm may be 1/R of the impedance of the input stage of the 'secondary branch' arm. The 'main branch' arm output stage may have an impedance equal to the 'main branch' arm input stage divided by the square root of (1+R). The 'secondary branch' output stage may have an impedance equal to the 'main branch' arm input stage divided by the square root of (R*(1+R)).

The splitter 902 shown in FIG. 3 is illustrated as being single ended, but it will be appreciated in the context of the present disclosure that differential embodiments may also be provided. It will also be appreciated in the context of the present disclosure that a printed coil inductor within the meaning of the present disclosure may be provided by a track of conductive material which follows a planar spiral path. Although this track may of course be laid down by additive techniques (e.g. by deposition), it need not be "printed" in the literal sense and may be provided by a subtractive technique—e.g. by etching away a layer to leave the spiral behind. The spiral may be any appropriate shape, such as square, rectangular, or circular. In addition, it will also be appreciated in the context of the present disclosure that high-Q printed coil inductors may have advantages in other smart card applications.

Figure 4:
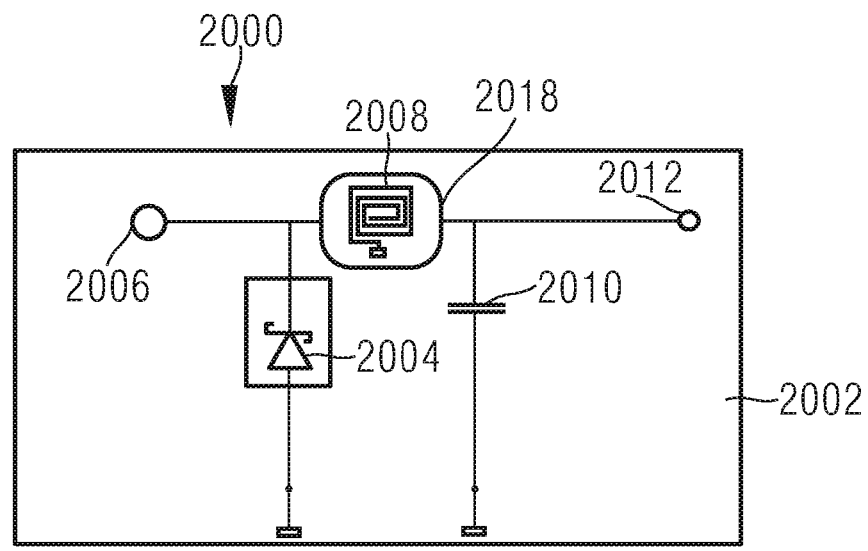
FIG. 4 shows an auxiliary rectifier for use a system such as that illustrated in FIG. 1.

FIG. 4 illustrates one such application. FIG. 4 shows an auxiliary rectifier apparatus 2000 for integration into a smart card having RF communications capability, such as near field RF communications or some other RF method, such as Bluetooth®.

The auxiliary rectifier apparatus 2000 shown in FIG. 4 may provide the rectifier described with reference to FIG. 1, above.

The auxiliary rectifier is provided on a dielectric substrate 2002 and comprises a rectifying element 2004 on said substrate 2002, an input connection 2006, a printed coil inductor 2008, a capacitor 2010, and an output connection 2012.

The printed coil inductor 2008 is connected in series between the input connection 2006 and the output connection 2012 of the rectifier. A first plate of the capacitor 2010 is connected to the output connection 2012. A second plate of the capacitor 2010 is connected to a ground or reference voltage. This second plate of the capacitor 2010 is also connected, by the printed coil inductor 2008, to the input connection 2006 and to an output of the rectifying element 2004. The input of the rectifying element 2004 is connected to a ground or reference voltage. It will be appreciated in the context of the present disclosure that, in this configuration the printed coil inductor 2008 and the capacitor 2000 together act to provide a low pass filter.

The rectifying element 2004 comprises a one-way electrical conduction path, which may be provided by a diode, such as a Schottky diode. The substrate 2002 carries a ground plane which underlies the at least the rectifying element, and in some cases also other circuitry components of the rectifier (such as any transmission lines or stubs).

The printed coil inductor is provided on a region 2018 of the substrate 2002 that does not comprise any ground plane—e.g. on an area of a major surface of the substrate in which there is no underlying ground plane (e.g. over a gap in the ground plane). This region is larger than the region occupied by the printed coil inductor, and the printed coil inductor is positioned within it so that its outer edges are surrounded by a margin, from which all other conductors are also absent as described above.

The input connection 2006 of the rectifier may be connected to the output of a near field RF communications antenna—e.g. via a splitter (such as one of those described elsewhere herein). If so, that splitter may also connect that antenna to a near field RF communications chip.

The substrate 2002 of the auxiliary rectifier illustrated in FIG. 4 may also carry other electrical components. Such as an RF communications chip, circuitry components for connection to such a chip, and auxiliary circuitry for providing additional functionality on the smart card such as biometric sensing and data processing.

Figure 5:
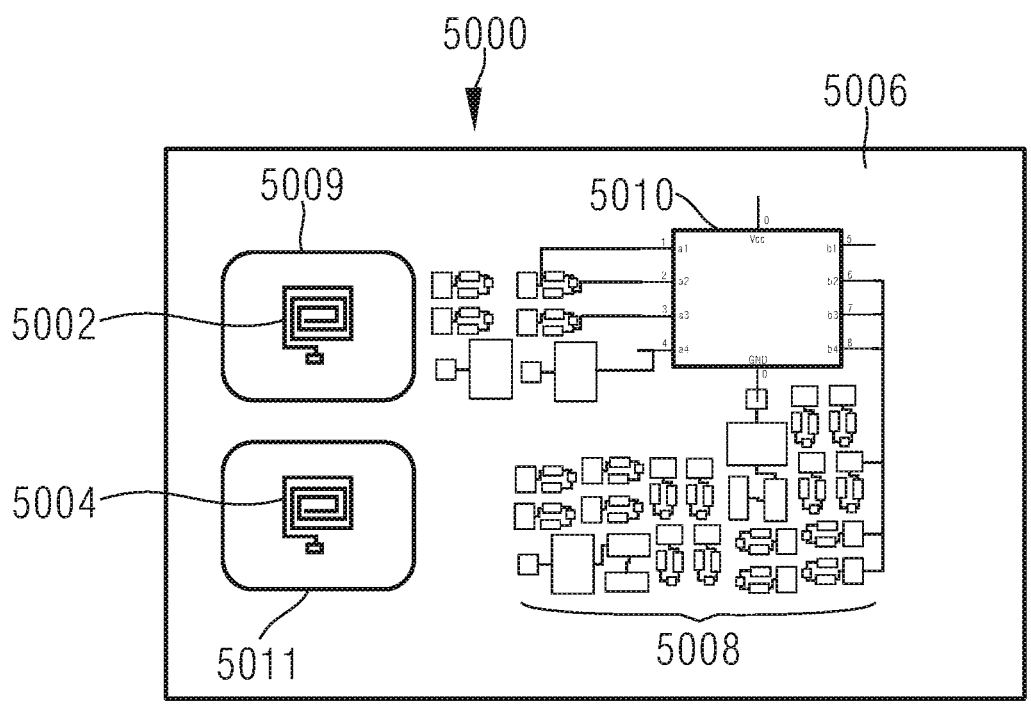
FIG. 5 shows a circuit assembly for integrating circuitry such as that illustrated in FIG. 3 and/or FIG. 4 into a smart card such as that shown in FIG. 1.

FIG. 5 shows a circuit assembly 5000 for integration into a smart card. The circuit assembly 5000 comprises printed coil inductors 5002, 5004, such as those described above, a sheetlike dielectric substrate 5006, and circuitry components 5008 for connection to a communications chip.

A first major surface of the sheetlike dielectric 5006 carries, in a first region of that surface, the circuitry components 5008, and perhaps also an IC, 5010 such as said communications chip.

The assembly 5000 also comprises a layer of conductive material on the second major surface of the substrate (not visible in FIG. 5). This layer of conductive material is thus separated from the circuitry components 5008 by the dielectric 5006 to provide a ground plane for the circuitry components 5008 and any IC 5010 in the first region.

A second region of the first major surface of the substrate 5006 carries two printed coil inductors 5002, 5004, which may be connected to the circuitry components 5008 and/or the IC 5010 by electrical connections such as conductive tracks, e.g. on the first major surface of the substrate. The layer of conductive material includes at least one gap 5009, 5011 which underlies this second region and is larger than it to provide a margin around the outer boundary of the printed coil inductor from which the ground plane is absent. For example, the gap 5009 is larger than and encompasses the printed coil inductor 5002, but is provided on the second major surface of the substrate.

The circuitry components 5008 may comprise an auxiliary rectifier, or an auxiliary rectifier may be provided (at least in part) by the IC. The printed coil inductors may be connected with such circuitry components and/or the IC to provide an auxiliary rectifier such as that described above with reference to FIG. 4.

The circuitry components may also be arranged to provide a power splitter for splitting an alternating electrical signal between the IC and such an auxiliary rectifier. For example a subset of the circuitry components may be connected to one or more of the printed coil inductors to provide an impedance network such as that described above with reference to FIG. 2.

In this and other embodiments described herein (such as those described with reference to FIG. 1) the splitter may be provided by any device which divides the received RF power between an RF communications apparatus and the auxiliary rectifier 1003. For example it may comprise an impedance network such as that described with reference to FIG. 2, e.g. a Wilkinson divider, or it may comprise an RF switch that first feeds power to the rectifier (possibly to do some biometric authentication, such as a fingerprint or similar), then switches the power to the RF communications chip (e.g. once the biometric authentication has been accepted).

It will be appreciated in the context of the present disclosure that the circuitry components described herein may comprise lumped components such as discrete capacitors and inductors, as distinct from distributed elements such as microstrips or transmission lines which provide spatially distributed capacitance and/or inductance along their length.

A printed coil inductor may comprise a laminar conductive coil on one surface of a dielectric, which follows a spiral path in from an input connection at the outside of the spiral to a connection through the dielectric inside the spiral. On the other side of the dielectric, a second laminar conductive coil may follow a mirror image of the same path out from this connection to an output connection at the outward edge of the spiral. The output connection may also be connected back through the dielectric so that input and output to the inductor may be provided on the same surface of the dielectric. The dielectric may comprise a substrate upon which a circuit is printed in the manner of a PCB. Other types of printed coil inductors may be used.

A printed coil inductor may comprise a conductive wire with an insulating coating placed on a surface of a dielectric, which follows a spiral path on just one side of the dielectric.

Embodiments of the present disclosure may provide circuit assemblies for integration into smart cards which are less than 0.5 mm thick (of which 0.1 mm may be accounted for by the substrate+copper, and 0.35 mm by other circuitry components). Such assemblies may then be integrated into a smart card by being sandwiched between other layers such as a plastic front and back of the card.

The sheetlike dielectric substrate described herein may be provided by any laminar dielectric, and may be flexible. One example is a polyaramide sheet, but other substrates may be used.

It will be appreciated from the discussion above that the embodiments shown in the Figures are merely exemplary, and include features which may be generalised, removed or replaced as described herein and as set out in the claims. With reference to the drawings in general, it will be appreciated that schematic functional block diagrams are used to indicate functionality of systems and apparatus described herein. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some embodiments the function of one or more elements shown in the drawings may be integrated into a single functional unit.

In some examples the IC described herein may comprise a controller, such as a microprocessor, configured to perform a method such as biometric authentication using power supplied from a near field RF communications antenna via a rectifier as described herein. In some examples the controller may comprise digital logic, such as field programmable gate arrays, FPGA, application specific integrated circuits, ASIC, a digital signal processor, DSP, or by any other appropriate hardware. In some examples, one or more memory elements can store data and/or program instructions used to implement the operations described herein. Embodiments of the disclosure provide tangible, non-transitory storage media comprising program instructions operable to program a processor to perform any one or more of the methods described and/or claimed herein and/or to provide data processing apparatus as described and/or claimed herein. The controller may comprise an analogue control circuit which provides at least a part of this control functionality. An embodiment provides an analogue control circuit configured to perform any one or more of the methods described herein.

The above embodiments are to be understood as illustrative examples. Further embodiments are envisaged. As just some examples, the present disclosure may provide a mounting system for a near field RF communications chip, the system comprising:

a substrate for carrying electronic components, and for providing electrical interconnections therebetween; a chip coupling carried by the substrate for connecting a near field RF communications chip to the mounting system; an auxiliary power provider, separate from said near field RF communications chip, and adapted for providing electrical power output based on a received alternating electrical signal; and, an antenna coupling for connecting a near field RF communications antenna to said mounting system; and a splitter, for splitting alternating electrical signals, the splitter comprising:

a first port connected to the antenna coupling and having a first input impedance; a second port connected to the first port and configured to provide a first part of the alternating electrical signal to the auxiliary power provider; and a third port connected to the first port and configured to provide a second part of the alternating electrical signal to the chip coupling; wherein the splitter is configured to maintain the first input impedance so that: the output impedance of the second port is maintained in the event of fluctuations in the output impedance of the third port; and the output impedance of the third port is maintained in the event of fluctuations in the output impedance of the second port. In an embodiment the splitter is carried on a substrate comprising a layer of conductive material (e.g. a ground plane) as described elsewhere herein and comprises a printed coil inductor, on a region of the substrate which is free from any ground plane, and connected in an impedance network configured to provide said maintaining, and a zone of the substrate surrounding the printed coil inductor is also free from any ground plane. Maintaining may comprise maintaining to within reasonable limits—e.g. so that any required impedance matching is not substantially degraded, e.g. so that the matching is not worsened by more than 70%, for example not more than 60%.

In an embodiment the first input impedance is matched to the output impedance of said near field RF communications antenna, and the output impedance of the second port is selected to match the input impedance of the near field RF communications chip.

In an embodiment the splitter is configured to provide, at the first port, variations in electrical load corresponding to the variations in electrical load at the third port. In an embodiment the splitter is configured so that the first part of the alternating electrical signal comprises more power than the second part of the alternating electrical signal. In an embodiment the splitter comprises a network of lumped components comprising said printed coil inductor. For example, wherein the network comprises a Wilkinson divider.

In an aspect there is provided a near field RF communications apparatus comprising: a near field RF communicator; an antenna for coupling with an alternating H-field; an auxiliary rectifier, separate from the near field RF communicator; and a splitter comprising a network of lumped components, wherein the network is connected to receive an alternating electrical signal from the antenna, and to provide a first part of the alternating electrical signal to the auxiliary rectifier and to provide a second part of the alternating electrical signal to the near field RF communicator. In an embodiment the network is carried on a substrate comprising a layer of conductive material (e.g. a ground plane) as described elsewhere herein and comprises a printed coil inductor provided on and surrounded by a region of the substrate that does not comprise any ground plane.

The splitter may comprise: a first port connected to the antenna and having a first input impedance; a second port connected, by the network, to the first port and connected to the auxiliary rectifier; and a third port connected, by the network, to the first port and to the near field RF communicator. The splitter may be configured so that: the output impedance of the second port is maintained in the event of fluctuations in the output impedance of the third port; and the output impedance of the third port is maintained in the event of fluctuations in the output impedance of the second port.

The first input impedance may be matched to the output impedance of the antenna, and the second port has an output impedance selected to match the input impedance of the near field RF communicator.

Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A power splitter for a smart card having near field RF communications capability, the power splitter comprising: a substrate for integration into said smart card; a first port for connection to a near field RF communications antenna for receiving an alternating electrical signal; a second port for connection to an auxiliary rectifier; and a third port for connection to a near field RF communicator; wherein the splitter comprises a impedance network, connected between the three ports to divide the alternating electrical signal between the second port and the third port to split the alternating electrical signal, wherein the impedance network comprises a printed coil inductor, and a zone of the substrate surrounding the printed coil inductor is free from any ground plane, wherein the substrate comprises a layer of conductive material comprising a gap in the layer beneath the region of the dielectric occupied by the printed coil inductor, wherein this gap is uninterrupted and surrounds and encompasses the region of the dielectric occupied by the printed coil inductor.

2. The apparatus of claim 1, wherein the impedance network provides a first input impedance to the near field RF communications antenna at the first port, wherein the first input impedance is matched to the output impedance of said near field RF communications antenna.

3. The apparatus of claim 2 further comprising a near field RF communications antenna, connected to said first port, for inductive coupling with another near field RF communicator via an alternating H-field to provide said alternating electrical signal to the first port.

4. The apparatus of claim 2 further comprising the near field RF communications chip connected to the third port wherein the impedance network provides an output impedance at the third port selected to match the input impedance of a near field RF communications chip.

5. The apparatus of claim 1 wherein the impedance network provides an output impedance at the second port selected to match the input impedance of an auxiliary rectifier and further comprising the auxiliary rectifier.

6. The apparatus of claim 5, wherein the auxiliary rectifier is implemented in lumped components.

7. The apparatus of claim 5, wherein the auxiliary rectifier is separate from any near field RF communications chip.

8. The apparatus of claim 1 wherein the output impedance of the second port is maintained in the event of fluctuations in the output impedance of the third port, and
the output impedance of the third port is maintained in the event of fluctuations in the output impedance of the second port.

9. The apparatus of claim 1 wherein the splitter provides, at the first port, variations in electrical load corresponding to the variations in electrical load at the third port.

10. The apparatus of claim 1 wherein the splitter is implemented in lumped components.

11. An auxiliary rectifier apparatus for integration into a smart card having RF communications capability, the apparatus comprising: a substrate carrying electrical components in said smart card for connection to a near field RF communications chip; and a rectifying element on said substrate separate from said near field RF communications chip for rectifying an alternating electrical signal provided from a near field RF communications antenna connected to said near field RF communications chip to provide an auxiliary power supply; wherein the rectifier further comprises a printed coil inductor, connected to the rectifying element, wherein the printed coil inductor is provided on and surrounded by a region of the substrate that does not comprise any ground plane, comprising a low pass filter on said substrate and connected to the output of the rectifying element; wherein the low pass filter comprises the printed coil inductor.

12. The apparatus of claim 11 wherein the printed coil inductor is connected between an input of the rectifying element and either (a) a ground or reference voltage; or (b) another input of the rectifier.

13. A smart card for carrying a chip having near field RF communications capability, the smart card comprising: a chip connection for connecting a near field RF communications chip; and a substrate carrying electrical components in said smart card for connection to said near field RF communications chip; wherein the electrical components comprise at least one printed coil inductor arranged for connection to said near field RF communications chip, a near field RF communications chip connected to the chip connection, wherein the printed coil inductor is connected to the chip to complete a power splitter circuit provided in part by components in the chip, wherein the smart card carries an auxiliary circuit connected to the chip connection to be powered by an auxiliary rectifier.

14. The smart card of claim 13, wherein the printed coil inductor is surrounded by a zone of the substrate that is free from any other electrical conductor.

15. The smart card of claim 13 wherein the auxiliary rectifier is provided by components in the near field RF communications chip and the printed coil inductor and the printed coil inductor provides a low pass filter connected between an output of said auxiliary rectifier and the auxiliary circuit.

16. A circuit assembly for integration into a smart card, the assembly comprising: a substrate comprising a sheetlike dielectric, wherein a first region of the sheetlike dielectric carries circuitry components and a ground plane conductor separated from the circuitry components by the dielectric to provide a ground plane for the circuitry components in the first region; and a second region of the sheetlike dielectric without any ground plane conductor carries a printed coil inductor connected to the circuitry components, which the second region has an area larger than the area of the substrate occupied by the printed coil inductor, wherein the around plane conductor comprises a layer of conductive material integrated with the sheetlike dielectric.

17. The circuit assembly of claim 16 in which the second region has an area larger than the area of the substrate occupied by the printed coil inductor, wherein the ground plane conductor comprises a layer of conductive material integrated with the sheetlike dielectric.

* * * * *